United States Patent
Sharif

(10) Patent No.: US 10,044,364 B1
(45) Date of Patent: Aug. 7, 2018

(54) METASTABILITY ERROR CORRECTION METHODS AND CIRCUITS FOR ASYNCHRONOUS SUCCESSIVE APPROXIMATION ANALOG TO DIGITAL CONVERTER (SAR ADC)

(71) Applicant: Infinera Corporation, Sunnyvale, CA (US)

(72) Inventor: Shah Sharif, San Jose, CA (US)

(73) Assignee: Infinera Corporation, Sunnyvale, CA (US)

( * ) Notice: Subject to any disclaimer, the term of this patent is extended or adjusted under 35 U.S.C. 154(b) by 0 days.

(21) Appl. No.: 15/820,621

(22) Filed: Nov. 22, 2017

(51) Int. Cl.
*H03M 1/12* (2006.01)
*H03M 1/46* (2006.01)
*H03M 1/06* (2006.01)
*H03M 1/38* (2006.01)

(52) U.S. Cl.
CPC ......... *H03M 1/468* (2013.01); *H03M 1/0697* (2013.01); *H03M 1/38* (2013.01); *H03M 1/46* (2013.01)

(58) Field of Classification Search
CPC .. H03M 1/0697; H03M 1/468; H03M 1/0809; H03M 1/0863; H03M 1/38; H03M 1/125; H03M 1/46
USPC .......................................... 341/118, 155, 163
See application file for complete search history.

(56) References Cited

U.S. PATENT DOCUMENTS

| | | | | |
|---|---|---|---|---|
| 8,482,449 B1* | 7/2013 | Zabroda | ............. | H03M 1/0863 341/118 |
| 8,872,691 B1* | 10/2014 | Stepanovic | ............. | H03M 1/06 341/144 |
| 8,957,802 B1* | 2/2015 | Evans | ................ | H03M 1/0863 341/155 |
| 8,988,268 B2* | 3/2015 | Sugimoto | ............... | H03M 1/38 341/118 |
| 9,484,945 B1* | 11/2016 | Wan | ........................ | H03M 1/46 |
| 9,621,179 B1* | 4/2017 | Maulik | ................. | H03M 1/466 |

* cited by examiner

*Primary Examiner* — Khai M Nguyen
(74) *Attorney, Agent, or Firm* — David Soltz

(57) ABSTRACT

Methods and apparatuses are described herein for metastability error detection and correction in analog-to-digital converters (ADCs). For example, an ADC may comprise a comparator, a register circuit, a first circuit, and a second circuit. The comparator may generate a comparator output signal in response to a sampling clock signal. The register circuit, operatively coupled to the comparator, may process the comparator output signal. The first circuit, operatively coupled to the comparator and the register circuit may generate a plurality of first output bits that include a bit indicating a metastability error on a condition that the metastability error occurred during the bit conversion. The second circuit, operatively coupled to the first circuit, may generate a plurality of second output bits indicating a location of the metastability error. The plurality of second output bits may be sampled using first and second groups in response to the sampling clock signal.

20 Claims, 9 Drawing Sheets

US 10,044,364 B1

METASTABILITY ERROR CORRECTION METHODS AND CIRCUITS FOR ASYNCHRONOUS SUCCESSIVE APPROXIMATION ANALOG TO DIGITAL CONVERTER (SAR ADC)

FIELD OF INVENTION

The disclosed embodiments are generally related to analog-to-digital converters (ADCs) and more specifically, to metastability error detection and correction for ADCs.

BACKGROUND

An analog-to-digital converter (ADC) is a system that converts an analog input signal into a digital output signal. One way to achieve such analog to digital conversion is by using a successive approximation analog-to-digital converter (SAR ADC). An SAR ADC performs successive comparison of input voltage signals to generated analog signals at each conversion cycle. The result of each comparison is used to generate the final output of digital signals, which is the digital representation of the analog input voltage signals. In typical SAR ADCs, these comparisons are performed by one or more comparators. If the analog signals to be compared are sufficiently close to each other in amplitude, the comparator may not be able to determine a digital output (i.e. logic level of 0 or 1) within the time required for proper operation. As a result, the SAR ADC falls into a metastable state and may react in unpredictable ways.

In a conventional SAR ADC, a metastability detector may use a timer circuit and memory element to detect a metastability event. For example, if a comparator does not make a decision within a certain amount of time, the bit is considered to be in a metastable state. When the metastability event is detected, existing detectors may stop the SAR ADC operation to prevent a system failure. However, these existing schemes are unreliable because the memory element itself can fall into a metastable state and therefore produce a false metastability error indication. In the event of the false metastability error indication, although all of the bits have enough time to be resolved from the metastability, the detectors may not check this condition because it stops the SAR ADC operation. Thus, it would be desirable to have methods and apparatuses that provide reliable metastability detection and corrections under the circumstances of false metastability error indications.

SUMMARY

Methods and apparatuses are described herein for metastability error detection and correction in analog-to-digital converters (ADCs). For example, an analog-to-digital converter (ADC) may comprise a comparator, a register circuit, a first circuit, and a second circuit to detect and correct metastability errors. The comparator may compare an analog input signals with a reference signal, thereby generating a comparator output signal in response to a sampling clock signal. The register circuit, operatively coupled to the comparator, may process the comparator output signal and generate a digital output signal indicating whether a bit is determined or not. The first circuit, operatively coupled to the comparator and the register circuit may generate a plurality of first output bits that include a bit indicating a metastability error on a condition that the metastability error occurred during the bit conversion. The second circuit, operatively coupled to the first circuit, may sample a plurality of second output bits using a first group of the plurality of first output bits and a second group of the plurality of first output bits, in response to the sampling clock signal. The plurality of second output bits may indicate a location of the metastability error. The plurality of second output bits may be sampled by a first group of the plurality of first output bits and a second group of the plurality of first output bits, in response to the sampling clock signal. The first group of the plurality of first output bits may be multiple bits positioned toward a most significant bit (MSB) and sampled at a rising edge of the sampling clock signal. The second group of the plurality of first output bits may be multiple bits positioned toward a least significant bit (LSB) and sampled at a falling edge of the sampling clock signal.

BRIEF DESCRIPTION OF THE DRAWINGS

A more detailed understanding may be had from the following description, given by way of example in conjunction with the accompanying drawings wherein.

DETAILED DESCRIPTION OF THE PREFERRED EMBODIMENTS

An analog-to-digital converter (ADC) may comprise a comparator, a register block, a detection block, and a correction block in order to detect and/or correct metastability errors occurring during a bit conversion process. For example, the comparator compares an analog input signal with a reference voltage and generates a comparator output signal in response to a sampling clock signal. The register block may process the comparator output signal and generate a digital output signal indicating whether a bit decision by the ADC is high (i.e. logic 1) or low (i.e. logic 0). The detection block may generate error location bits that indicate the location of a metastability error that may have occurred during the bit conversion process.

The correction block, operatively coupled to the detection block, may generate ADC output bits. In the case of a metastability error, the correction block may correct the error bit based on the error location bits. Thus, the ADC output bits may include the correction of the metastability error bit. The error location bits may be sampled based on groups at different times. For example, an ADC with a resolution of 8 bits, a first group of the error location bits (e.g., $1^{st}$ bit to $4^{th}$ bit) is sampled (or read) earlier than a second group of the error location bits (e.g., $5^{th}$ bit to $8^{th}$ bit). Specifically, the first group of error location bits may be sampled (or read) at the rising edge of the sampling clock signal, and the second group of error location bits may be sampled at the falling edge of the sampling clock signal. By sampling the error location bits at different times, the memory element of the detection block may be given a longer time to recover from a metastability event during the bit conversion process. Thus, the possibility of a false metastability error indication by the memory element is greatly reduced.

Figure 1:
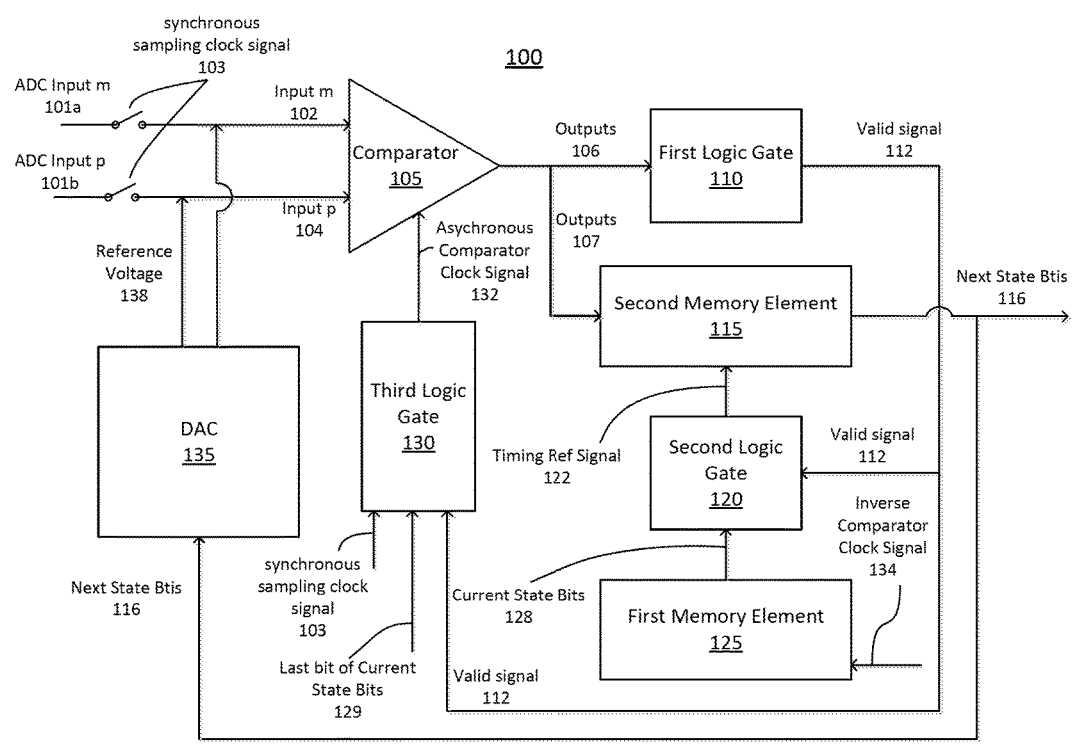
FIG. 1 is a block diagram illustrating an example successive approximation analog-to-digital converter (SAR ADC)

FIG. 1 is a block diagram illustrating an example SAR ADC 100, which may be used in combination with any of the embodiments described herein. The SAR ADC 100 may comprise a comparator 105, a first logic gate 110, a second logic gate 120, a third logic gate 130, a first memory element 125, a second memory element 115, and a digital-to-analog converter (DAC) 135.

A comparator 105 is a device that compares two analog input voltages or currents and produces a digital signal indicating which one of the analog input voltages is larger. For example, the SAR ADC 100 may receive two analog input voltages, ADC input m 101a and ADC input p 101b and sample those inputs into input m 102 and input p 104. The comparator 105 may then process the sampled input m 102 and sampled input p 104 and generate binary digital outputs 106, 107. The sampled input m 102 and sampled input p 104 may be initialized to a high state such as 1.0 volts. When an asynchronous comparator clock signal 132 becomes low (i.e. logic 0), the comparator 105 may initiate an evaluation operation of the sampled input m 102 and sampled input p 104. This means that after the asynchronous comparator clock signal 132 became low, the comparator 105 may decide which analog input voltage is larger among the sampled input m 102 and the sampled input p 104. After determining the larger input, the comparator 105 may produce one or more outputs 106, 107 such as an output m and output p. Each of the output p and output m may be a binary logic signal indicating logic 0 and/or logic 1. If the sampled input m 102 is larger than the sampled input p 104, the output m may be logic 1 and the output p may be logic 0. In another example, if the sampled input p 104 is larger than the sampled input m 102, the output p may be logic 1 and the output m may be logic 0. Thus, after the evaluation operation, outputs 106 may enter into the first logic gate 110 for further processing.

The comparator 105 may also perform a precharge operation when an asynchronous comparator clock signal 132 becomes high (i.e. logic 1). This means that the comparator 105 does not evaluate which one of analog input voltages is larger among the sampled input m 102 and sampled input p 104 when the asynchronous comparator clock signal 132 is high (i.e. logic 1). Accordingly, the comparator 105 may produce the same logic level of outputs 106, 107 during the precharge operation. For example, both output m and output p from the comparator 105 are high (i.e. logic 1) after the asynchronous comparator clock signal 132 reached at the comparator 105 becomes high (i.e. logic 1). Thus, the same logic level of outputs 106, 107 may be entered into the first logic gate 110 and the second memory element 115 for further processing.

The first logic gate 110 is a physical device implementing a Boolean function. For example, the first logic gate 110 may perform a logical operation on one or more comparator output 106 and produce a single binary output. This single binary output may be referred to as a valid signal 112. The first logic gate 110 may be implemented using diodes or transistors acting as electronic switches, but can also be constructed using vacuum tubes, electromagnetic relays (relay logic), fluidic logic, pneumatic logic, optics, molecules, mechanical elements, or the like. The first logic gate 110 may be any type of circuits configured to perform a logical function. Examples of the first logic gate 110 may include, but are not limited to, a NOT gate, an AND gate, an OR gate, a XOR gate, a NAND gate, a NOR gate, and a XNOR gate.

As described above, the comparator 105 may initiate an evaluation operation of input m 102 and input p 104 when an asynchronous comparator clock signal 132 becomes low (i.e. logic 0). Once the comparator 105 produces outputs 106, 107, the first logic gate 110 may perform a logical operation on the outputs 106 to generate a valid signal 112. For example, assuming that the first logic gate 110 is a NAND gate, the first logic gate 110 performs the NAND operation on the output m and output p. If the output m and output p are different (e.g., output m is logic 1 and output p is logic 0), the first logic gate 110 may generate an output of logic 1 as the valid signal 112. However, if the output m and output p are the same (e.g., output m is logic 1 and output p is logic 1), the first logic gate 110 may generate an output of logic 0 as the valid signal 112. Thus, during the evaluation operation, the valid signal 112 is determined as high (i.e. logic 1), but during the precharge operation, the valid signal 112 is determined as low (i.e. logic 0), after processing delays at the comparator 105 and the first logic gate 110.

The first memory element 125 may comprise multiple flip flops to generate multiple current state bits 128. A flip flop used herein is a circuit that has two stable states and can be used to store state information. The circuit can be made to change state by signals applied to one or more control inputs and will have one or two outputs. The flip flops can be clocked (e.g., synchronous or edge-triggered). This means that the flip flop is edge-sensitive and a flip flop's output only changes on a single type (positive going or negative going) of clock edge. Each of the flip flops in the first memory element 125 may be any type of flip flops such as simple set-reset latches, gated latches, D flip flop, T flip flop, JK flip flop, or the like.

The number of flip flops in the first memory element 125 may depend on the number of ADC output bits that the SAR ADC 100 can process. For example, if the SAR ADC 100 is an 8-bit ADC, the first memory element 125 may include 8 flip flops. If the SAR ADC 100 is a 16-bit ADC, the first memory element 124 may have 16 flip flops. In an embodiment, one or more additional flip flops may be added to the first memory element 125 to generate the most significant or least significant bit of the current state bits 128. Specifically, if the SAR ADC 100 is an 8-bit ADC, the first memory element 125 may include 8+1 flip flops to generate the current state bits 128.

The first memory element 125 may be initialized by a synchronous sampling clock signal 103 (or synchronous sampling reference signal). Specifically, when the synchronous sampling clock signal 103 is initialized to a high state (i.e. logic 1), the first memory element 125 may be initialize to a high or low state. For example, assuming that the SAR ADC 100 is an 8-bit ADC with 9 flip flops (flip flop 0 to flip flop 8) in the first memory element 125, the flip flop 0 may be set by the initial synchronous sampling clock signal 103 and the flip flops 1 to 8 may be reset by the initial synchronous sampling clock signal 103. This means that the output of flip flop 0 is initialized to a high state (i.e. logic 1) and the outputs of flip flops 1 to 8 are initialized to a low state (i.e. logic 0). As described above, the synchronous sampling clock signal 103 may be initialized to a high state (i.e. logic 1) when the switches are connected. When the switches are disconnected, the synchronous sampling clock signal 103 may change from high (i.e. logic 1) to low (i.e. logic 0) and the SAR ADC 100 may initial the evaluation process.

As described above, the first memory element 125 may generate current state bits 128 after the comparator 105 initiates an evaluation operation of input m 102 and input p 104. This means that the flip flops 1-8 may generate, based on an inverse comparator clock signal 134, the current state bits 128 after an asynchronous comparator clock signal 132 changes from high to low. The inverse comparator clock signal 134 may be an inverse signal of the asynchronous comparator clock signal 132. When the asynchronous comparator clock signal 132 changes from high to low, the inverse comparator clock signal 134 may change from low to high. Accordingly, at the rising edge of the inverse comparator clock signal 134, the flip flop 1 may capture the value of input (e.g., D=1). The captured value may become the output of flip flop 1 (e.g., Q=1), which is the first current state bit 128. At each conversion cycle, the flip flops 2-8 generate the rest of current state bits 128 in a sequential order as described above. It should be noted that each of the current state bits 128 may be generated earlier than the valid signal 112 at each conversion cycle. It is because the inverse comparator clock signal 134 may be generated right after the asynchronous comparator clock signal 132 falls (i.e. from high to low). However, the valid signal 112 may be generated after processing delays at the comparator 105 and the first logic gate 110. Thus, generating the current state bits 128 is faster than generating the valid signal 112.

Similar to the first logic gate 110, a second logic gate 120 is a physical device implementing a Boolean function. For example, the second logic gate 120 may perform a logical operation on current state bits 128 and a valid signal 112, thereby producing a single binary output. This single binary output may be referred to as a timing reference signal 122. Similar to the first logic gate 110, the second logic gate 120 may be primarily implemented using diodes or transistors acting as electronic switches, but can also be constructed using vacuum tubes, electromagnetic relays (relay logic), fluidic logic, pneumatic logic, optics, molecules, mechanical elements, or the like. The second logic gate 110 may also be any type of circuits configured to perform a logical function. Examples of the second logic gate 120 may include, but are not limited to, a NOT gate, an AND gate, an OR gate, a XOR gate, a NAND gate, a NOR gate, and a XNOR gate.

Assuming that the second logic gate 120 is an AND gate, the second logic gate 120 may generate a timing reference signal 122 when the valid signal 112 and the current state bit 128 are asserted (i.e. both high). As described above, since the current state bit 128 are already generated at the first memory element 125 when the valid signal 128 is reached at the second logic gate 120, a total time of generating the timing reference signal 122 may be the sum of processing delays at the comparator 105, the first logic gate 110, and the second logic gate 120.

The second logic gates 120 may include multiple logic gates that are connected to multiple flip flops in the first memory element 125. For example, assuming that the SAR ADC 100 is an 8-bit ADC with 9 multiple flip flops (e.g., flip flops 0-9), the SAR ADC 100 may include 8 second logic gates 120 (e.g., second logic gates 1-8) that are coupled to each of the flip flops 1-8 respectively to receive corresponding current stat bits 128.

Similar to the first memory element 125, the second memory element 115 may comprise multiple flip flops to generate multiple next state bits 116. For example, the second memory element 115 may include flip flops S1-S3 to generate three next state bits 116. The second memory element 115 may be initialized by a synchronous sampling clock signal 103 (or synchronous sampling reference signal). Specifically, the flip flops S1-S3 in the second memory element 115 may be reset by the synchronous sampling clock signal 103. This means that outputs of the flip flops S1-S3 are initialized to a low state (i.e. logic 0). Similar to flip flops 0-8 in the first memory element 125, each of the multiple flip flops S1-S3 in the second memory element 115 may be any type of flip flops such as simple set-reset latches, gated latches, D flip flop, T flip flop, JK flip flop, or the like.

When a timing reference signal 122 changes from low to high (i.e. at the rising edge), the flip flops S1-S3 of the second memory element 115 may capture the values of comparator outputs 107. The captured values may become the Q outputs of the flip flops S1-S3, which are next state bits 116. It should be noted that the SAR ADC 100 may include multiple second memory elements 1-8 115 that are connected to multiple second logic gates 120. For example, assuming that the SAR ADC 100 is an 8-bit ADC, each of the second memory elements 1-8 115 are coupled to each of the second logic gates 1-8 120 respectively. This means that each flip flop in second memory elements 1-8 115 may be connected to each of the second logic gates 1-8 120 to generate next state bits 116.

Similar to the first and second logic gates 110, 120, a third logic gate 130 is a physical device implementing a Boolean function. For example, the third logic gate 120 may perform a logical operation based on a valid signal 112, a synchronous sampling clock signal 103, and a last bit of the current state bits 129, thereby producing a single binary output. This single binary output may be referred to as an asynchronous comparator clock signal 132. This asynchronous comparator clock signal 132 may control a precharge operation and an evaluation operation of the comparator 105. For example, when the asynchronous comparator clock signal 132 is low (i.e. logic 0), the comparator 105 may initiate the evaluation operation as described above. When the asynchronous comparator clock signal 132 is high (i.e. logic 1), the comparator 105 may initiate the precharge operation as described above.

The third logic gate 130 may be primarily implemented using diodes or transistors acting as electronic switches, but can also be constructed using vacuum tubes, electromagnetic relays (relay logic), fluidic logic, pneumatic logic, optics, molecules, or even mechanical elements. The third logic gate 130 may be any type of circuits configured to perform a logical function such as a NOT gate, an AND gate, an OR gate, a XOR gate, a NAND gate, a NOR gate, a XNOR gate, or the like.

The digital-to-analog converter (DAC) 135 is a device that converts a digital signal into an analog signal. The DAC 135 may include multiple capacitors and switches to generate a reference voltages 138 based on the next state bits 116. These reference voltages 138 may affect the analog input voltage of the input m 102 and input p 104, thereby increasing or decreasing the analog voltage of the input m 102 and input p 104 based on the reference voltages 138.

A critical path may be referred to as a bus or a transmission path on which signals are dropped off or picked up to generate a timing reference signal 122 and next state bits 116. For example, a critical path may connect the comparator 105, first logic gate 110, second logic gate 120, second memory element 115 and DAC 135 with each other. There may be various critical paths depending on topology of SAR ADCs. As described above, the current state bits 128 are already generated before the valid signal 112 is reached to the second logic gate 120, the timing reference signal 122 may be generated without a processing delay of the first memory element 125. This may result in a faster generation of next state bits 116 because it only includes a processing delay of one memory element (i.e. second memory element 115) and minor logic gate delays (i.e. first logic gate 110 and second logic gate 115).

Figure 2:
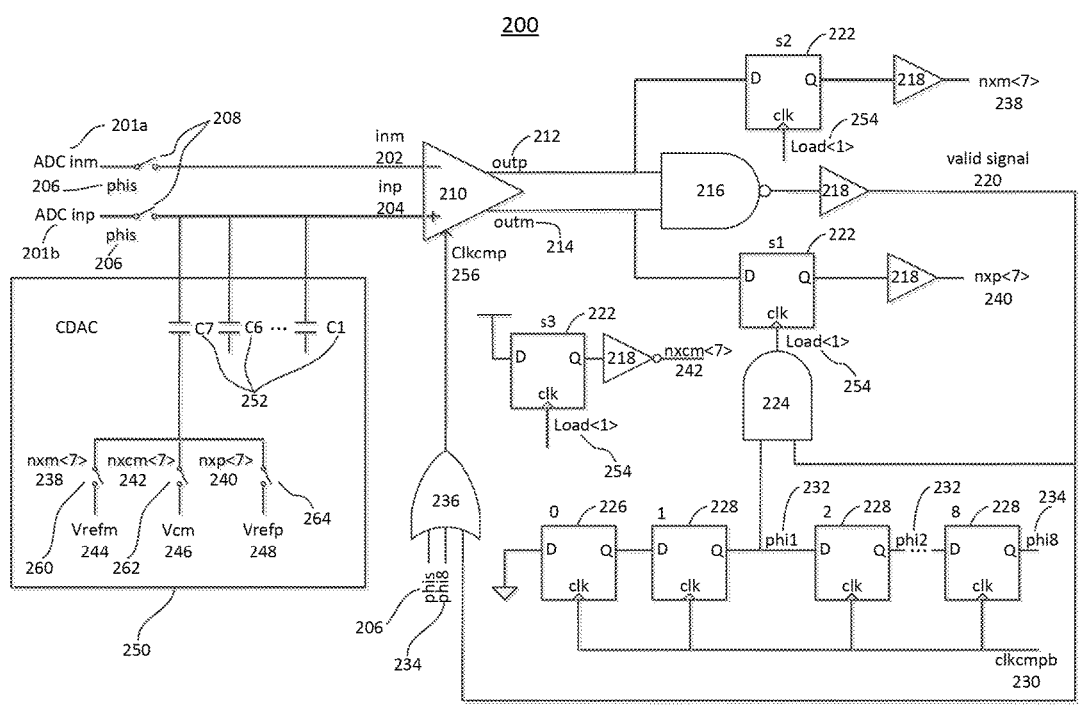
FIG. 2 is a circuit diagram illustrating an example SAR ADC with asynchronous clock generation.

FIG. 2 is a circuit diagram illustrating an example SAR ADC 200, which may be used in combination with any of other embodiments described herein. The SAR ADC 200 may comprise switches 208, a comparator 210, a NAND gate 216, buffer amplifiers 218, an AND gate 224, flip flops 0-8 226, 228, flip flops S1-S3 222, an OR gate 236, and a capacitor DAC (CDAC) 250.

The process of analog to digital conversion may be initiated after the analog input signals, ADC inm 201a and ADC inp 201b, are sampled by clock phis 206. For each analog to digital conversion, the clock phis 206 pulse may be sent from an external clock source. When the clock phis 206 is high (i.e. logic 1), the ADC inm 201a and ADC inp 201b may be connected to comparator inputs, inm 202 and inp 204. During this time (i.e. when the clock phis is high), the ADC inm 201a and ADC inp 201b are sampled at the inm 202 and inp 204. When the clock phis 206 is low (i.e logic 0), the ADC inm 201a and ADC inp 201b are disconnected from the inm 202 and inp 204. During this time (i.e. when the clock phis is low), the SAR ADC 200 may continue bit cycling process. After sampling the ADC inm 201a and ADC inp 201b, the inm 202 and inp 204 may become analog input voltages ranging from Vrefm 244 to Vrefp 248 volts as examples. The inm 202 and inp 204 may be initialized to a high state such as 1.0 volts. The phis 206 may be a synchronous sampling clock or a synchronous sampling reference signal that initializes clkcmp 256 and clkcmpb 230 signals. The phis 206 may also initialize all the flip flops 222, 226, 228. Specifically, when the switches 208 are connected and the phis 206 becomes a high state (i.e. logic 1), the phis 206 may initially set output of flip flop 0 226 (i.e. Q=1) and reset outputs of flip flops 1-8 (i.e. Qs=0). Moreover, the phis 206 may reset flip flops S1-S3 222 (i.e. Qs=0).

When the phis 206 is initially high (i.e. logic 1) and ADC inputs (i.e. ADC inm 201a and ADC inp 201b) are sampled at comparator input (i.e. inm 202 and inp 204), the clkcmp 256 signal may be initialized high (i.e. logic 1) because of the phis 206 signal in the OR gate 236. Specifically, with the high state of phis 206, the OR gate 236 results in the high state (logic 1) together with a phi8 234 and a valid signal 220. When the clkcmp 256 signal is high, the comparator 210 may be in a precharge state. This means that the comparator 210 may not determine which analog input voltage is larger among the inm 202 and inp 204. Thus, when the clkcmp 256 is high, both outp 212 and outm 214 result in high states (i.e. logic 1s). Since the outp 212 and outm 214 are both high, the valid signal 220 may become low (i.e. logic 0) after the outp 212 and outm 214 are processed at the NAND gate 216.

When the switches 208 are disconnected and the phis 208 falls to a low state (i.e. logic 0), the SAR ADC 200 may start a bit cycling of analog to digital conversion inside the SAR ADC loop. In other words, at the falling edge of phis 208, the comparator 210 may come out of the precharge state (reset) and enter into an evaluation phase. In FIG. 2, an example of 8 bit conversion is shown. When the phis 208 becomes low, the clkcmp 256 may go from high to low because the OR gate 236 results in a low state (because phis 208, phi8 234, and valid signal 220 are all low at this point). At this point, current state bits, phi1-phi8 232, 234, may be generated at the falling edge of the clkcmp 256 because the clkcmpb 230 is the inverse of the clkcmp 256 signal.

Specifically, when the clkcmp 256 goes into a falling edge (i.e. from high to low), the clkcmpb 230 goes into a rising edge (i.e. from low to high) and the flip flop 0 226 may capture the value of D input (i.e. 0). Since the output Q of the flip flop 0 226 was initially set by the phis 208 (i.e. Q=1), the flip flop 1 228 captures the value of input D (i.e. 1) at the rising edge of the clkcmpb 230. The captured value becomes the Q output (i.e. 1) of the flip flop 1 228. This output Q becomes the phi1 232 signal. At the rising edge of the clkcmpb 230, the flip flops 2-8 may generate phi2-phi8 232, 234 signals as described above. The phi1-phi8 232, 234 are the current state bits indicating the present bit that the SAR ADC is processing. These phi1-phi8 232, 234 signals may remain asserted up to the duration of the processing time of the current bit ADC processing, and then each of them are de-asserted. This example of generating the bit by bit state signal may be achieved by adding one extra flip flop (i.e. flip flop 0 226).

After the current state bits (i.e. phi1-phi8 232, 234) are generated by the flop flops 1-8 226, 228, the clkcmp signal 256 may change from low to high by phi8 234 at the OR gate 236. The comparator 210 may then enter in a precharge phase and the SAR ADC 200 may be ready for next conversion. As described above, when the phis 208 becomes low, the clkcmp 256 may go from high to low. When the clkcmp 256 signal becomes low, the comparator 210 may be enabled and enter into an evaluation phase. This means that the comparator 210 may decide which analog input voltage is larger among the inm 202 and inp 204. After the determination of the comparator 210, one of outp 212 and outm 214 is always larger than the other output value. Since the outp 212 and outm 214 are different, the NAND gate 216 may generate the valid signal 220 that is high (i.e. logic 1). In an embodiment, a buffer amplifier (or buffer) 218 may be used before generating the valid signal 220 to prevent the signal source from being affected by whatever currents (or voltages, for a current buffer) that the load may produce.

With the valid signal 220 and the current state bits 232, an AND gate 224 may produce a timing reference signal. For example, the AND gate may perform a logical operation with the phi1-phi8 232, 234 and the valid signal 220, thereby producing the timing reference signal, load<1> 254. It should be noted that the current state bits (i.e. phi1-phi8 232, 234) are already generated before the valid signal 220 is reached to the AND gate 224. In this way, the critical path delay that involves processing flip flops 1-8 228 with the valid signal 220 may be reduced in generating the timing reference signal, load<1> 254. Although it is not shown in FIG. 2, there may be multiple AND gates 224 to generate multiple timing reference signals such as load<2> to load<8> based on the valid signal 220 and corresponding current state bits, phi2-phi8 232, 234.

As described above, a critical path may be referred to as a bus or a transmission path on which signals are dropped off or picked up at circuit devices in the SAR ADC 200 to generate a timing reference signal (e.g., load<1> 254) and next state bits (e.g., <7> 238, nxp<7> 240, and nxcm<7> 242). In FIG. 2, a bus connecting the comparator 210, NAND gate 216, buffer amplifier 218, AND gate 224, flip flops S1-S3 222, and CDAC 250 may be referred to as a critical path.

At flip flops S1-S3 222, the timing reference signal, load<1> 254, may be used to generate next state bits, nxm<7> 238, nxp<7> 240, and nxcm<7> 242. Specifically, when the load<1> 254 signal is in a rising edge (i.e. from low to high), the flip flops S1, S2 222 may capture the values of D inputs, which are the output of the comparator 210 (i.e. outm 214 and outp 212). The captured values may become the Q output of the flip flops S1, S2 222 which are essentially the next state bits (i.e. nxm<7> 238 and nxp<240> 240). Similarly, the flip flop S3 222 may also capture the value of D input (i.e. logic 1) at the rising edge of the load<1> 254 signal. The captured value may become the Q output of the flip flops S3 222, which is essentially the next state bit (i.e. nxcm<7> 242). In an embodiment, buffer amplifiers (or buffers) 218 may be used before generating the next state bits (i.e. nxm<7> 238, nxp<7> 240, and nxcm<7> 242) to prevent the signal source from being affected by whatever currents (or voltages, for a current buffer) that the load may produce. It should be noted that other next state bits such as nxm<6> to nxm<0>, nxp<6> to nxp<0>, and nxcm<6> to nxcm<0> may be generated at the corresponding rising edges of load signals such as load<2> to load<8> as described above.

As the current state bits, phi1-phi8 232, 234 are specific to the bit position that the SAR ADC 200 is processing, the timing reference signal, load<1> to load<8> 254, may have the same characteristics to the current state bits, phi1-phi8 232, 234. This means that the load <1> to load<8> signals may change from low to high as the phi1-phi8 signals change from low to high (i.e. specific to bit position). The load<1> 254 signal may be used to produce the next state bits (nxm<7> 238, nxp<7> 240, nxcm<7> 242) with one memory element (i.e. flip flops S1-S3 222), and removing all other memory element (i.e. flip flops 1-8 228) from a critical path to generate the load<1> 254 signal. In other words, because the current state bits, phi1-phi8 232, 234, are already generated when the valid signal 220 reached at the AND gate 224, the SAR ADC 200 may only use the flip flops S1-S3 222 to generate the next state bits, nxm<7> 238, nxp<7> 240, nxcm<7> 242. The SAR ADC 200 may not need to use the flip flops 0-8 226, 228 with the valid signal 220 to generate the current state bits, phi1-phi8 232, 234. Because the flip flops 0-8 226, 228 are not included in the critical path, the timing reference signal (i.e. load<1> 254) may be produced faster than a timing reference signal that may be produced by the flip flops 0-8 226 228 using the valid signal 220. Thus, a critical path delay that involves the processing time of flip flops 0-8 226 228 may be significantly reduced.

Accordingly, the timing equations that limits the critical path delay for generating next state bits 238, 240, 242 to only one memory element with minor logic gate delay may be expressed as follows:

$$T_{(next\ state)} = T_{comp(inp)} + T_{valid} + T_{flop} + T_{buffer} + T_{and} \quad \text{Equation (1)}$$

$$T_{bit} = T_{(next\ state)} + \max(T_{precharge}, T_{cdac}) \quad \text{Equation (2)}$$

$$T_{precharge} = T_{logic} + T_{compreset} \quad \text{Equation (3)}$$

In Equation (1), $T_{(next\ state)}$ is time to generate next state bits (e.g., nxm<7> 238, nxp<7> 240, nxcm<7> 242), $T_{comp(inp)}$ is time that a comparator 210 processes inputs (e.g., inm 202 and inp 204) and produces output (e.g., outp 212 and outm 214). $T_{valid}$ is time to generate a valid signal 220. $T_{flop}$ is time that flip flops S1-S3 process a timing reference signal (e.g., load<1> 254) and outputs of the comparator. $T_{buffer}$ is time that a buffer amplifier 218 process signals. $T_{and}$ is time that an AND gate 224 processes a valid signal 220 and a current state bits (e.g., phi1-phi8). In Equation (2), $T_{bit}$ is entire conversion time that one analog input is converted to digital output. $T_{precharge}$ is time when the comparator is in precharge operation. $T_{cdac}$ is time that CDAC 250 processes next state bits. In Equation (3), $T_{logic}$ is signal processing time at OR gate 236. $T_{compreset}$ is processing time that clkcmp signal 256 is reset at the comparator 210.

Next state bits (e.g., nxm<7> 238, nxp<7> 240, nxcm<7> 242) may be used to set a CDAC 250 so that sub multiple of reference voltage can be added or subtracted from a sampled input (e.g. inp 204) and a comparator 210 that is ready for the next bit conversion. The CDAC 250 may comprise multiple switches 260, 262, 264 connected to the next state bits (e.g., nxm<7> 238, nxp<7> 240, nxcm<7>242), and multiple capacitors (e.g. C1-C8 252) to add or subtract the sub multiple of reference voltages (e.g. Vrefm 244, Vcm 246, Vrefp 248). The reference voltages may range from 0.0 to 0.25 volts. In one embodiment, Vcm 246 may be 0.125 volts, Vrefp 248 may be 0.25 volts, and Vrefm 244 may be 0.0 volts.

The switch 262 is initially connected because the nxcm<7> 242 is initially high (i.e. logic 1). Thus, the bottom plate of the C7 252 may be connected to the Vcm 246 and the top place of C7 252 may store a sampled input, inp 204. Once the comparator 210 initiates an evaluation operation and flip flops S1-S3 222 generates next state bits (nxm<7> 238, nxp<7> 240 and nxcm<7> 242), the switch 262 for nxcm<7> 242 is disconnected because the nxcm<7> 242 becomes a low state (logic 0). Simultaneously, one of next state bits (nxm<7> 238 and nxp<7> 240) becomes a high state (i.e. logic 1) and the other becomes a low state (i.e. logic 0). This means that one of switches 260, 264 is connected and the other is disconnected. For example, if nxm<7> 238 is high (i.e. logic 1) and nxp<7> is low (i.e. logic 0), the switch 260 is connected and the switch 264 is disconnected. Accordingly, the Vrefm 244 is connected to the bottom plate of C7. If a reference voltage is higher than Vcm 246, (i.e. Vrefp is selected by next state bits), the bottom plate of C7 252 stores electronic charges, thereby increasing voltage of the top plate of C7 252. This may add voltages of input signal inp 204. On the other hand, if a reference voltage is lower than Vcm 246 (i.e. Vrefm is selected by the next state bits), the bottom plate of C7 252 reduces electronic charges, thereby decreasing voltage of the top plate C7 252. This may subtract voltages of input signal inp 204. Thus, changes in the top plate of C7 252 may affect the comparator 210 in the next evaluation.

In analog-to-digital converter (ADC), metastability detectors may detect metastability by using a timer circuit and a memory element. Specifically, after a comparator initiates the evaluation of analog input signals, a fixed amount of time may be used to check whether a bit that the comparator is trying to resolve is in a metastable state or not. If the comparator cannot determine a digital output (i.e. logic level of 0 or 1) within the fixed amount of time, the bit may be considered to be in a metastable state. A delay block may generate a timeout signal that has the fixed amount of time from the start of the comparator's evaluation. This timeout signal may be used as a clock signal for the memory element that captures the comparator outputs. Specifically, a logic gate such as an exclusive NOR (XNOR) gate may be coupled to the memory element and provide an input signal to the memory element after processing a logical operation on the comparator output. When a metastability error occurred in the comparator, the timeout signal may be generated by the delay block and the logic gate output may be captured by the memory element when the timeout signal is reached at the memory element. Once the memory element captures the logic gate output, the memory element may generate a bit (i.e. error location bit) indicating a metastability error.

Figure 3:
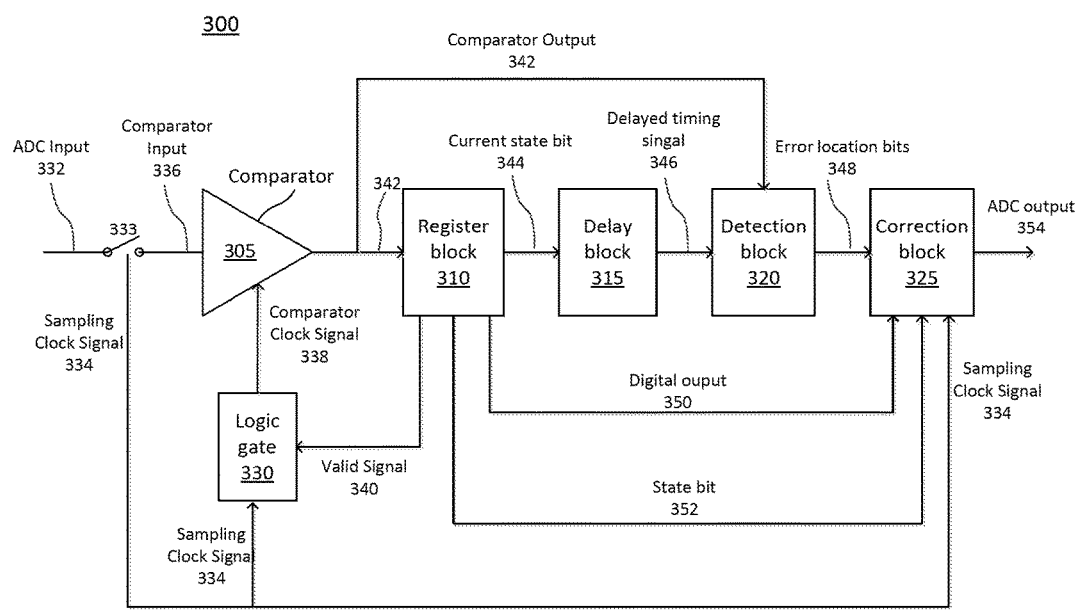
FIG. 3 is a block diagram illustrating an example SAR ADC for metastability error detection and correction.

FIG. 3 is a diagram illustrating an example SAR ADC 300 for metastability error detection and correction, which may be used in combination with any of the other embodiments described herein. The SAR ADC 300 may comprise a comparator 305, a register block 310, a delay block 315, a detection block 320, a correction block, and a logic gate 330. The SAR ADC 300 may receive analog ADC input signals 332 to be converted to digital ADC output signals 354. The ADC input 332 may be sampled by a switch 333 and changed to sampled comparator input signals 336. The comparator 305 may receive the comparator input signals 336 and initiate the evaluation of the comparator input signals 336 when the comparator clock signal 338 becomes low (i.e. logic 0). The comparator clock signal 338 may control the evaluation operation or precharge operation of the comparator 305 as described above. The comparator clock signal 338 may be generated from the logic gate 330 based on a valid signal 340 and a sampling clock signal 334 as described in FIG. 1. The logic gate 330 may be the same as or similar to the third logic gate 130 as described in FIG. 1.

The comparator input signals 336 may include two sampled input m and sampled input p as described above with respect to FIGS. 1 and 2. When the amplitude between the input m and the input p is small, the comparator 305 may need long time to determine (or resolve) a comparator output 342 (i.e. digital value of 0 or 1). If the amplitude between the input m and the input p approaches zero, the comparator needs infinite amount of time to resolve to the comparator output 342. Thus, when the comparator 305 cannot resolve the comparator output 342 within a predetermined duration that is required for the proper operation of the SAR ADC 300, it may produce a metastability error. When the comparator 305 is in the metastable state due to the metastability error, the comparator output 342 may not change its initial state (e.g., logic 1) and keeps it until the comparator 305 recovers from the metastability error (i.e. produces the comparator output 342 sometime after the predetermined duration). As described in FIG. 2, the comparator output 342 may include two outputs, output m 212 and output p 214. The two output m 212 and output p 214 are the same when the comparator 305 is in a metastable state.

The register block 310 may include logic gates and memory elements to process the comparator output 342. For example, the register block 310 comprises a first logic gate 110, second logic gate 120, first memory element 125, and second memory element 115 as described in FIG. 1. After the comparator 305 generates the comparator output 342 and send it to the register block 310, the register block 310 may process the comparator output 342 to generate a valid signal 340, current state bits 344, digital output bits 350, and state bits 352 as described above with respect to FIGS. 1 and 2. The digital output bit 350 may indicate a bit decision (i.e. logic 0 or 1) of each conversion cycle and may be the output of S2 flip flop 222 described in FIG. 2. The state bit 352 may indicate whether a bit of each conversion cycle is completely resolved or not by the comparator 305. If the state bit 352 is high (i.e. logic 1), the bit that the register block 310 is currently processing is determined (i.e. converted). This may indicate that there is no error occurred during the bit conversion process. If the state bit 352 is low (i.e. logic 0), the bit that the register block 310 is currently processing is not determined (i.e. not converted). This may indicate that there is a metastability error occurred during the bit conversion process.

The delay block 315 may include a programmable delay circuit and a logic gate to generate a delayed timing signal 346. The delayed timing signal 346 may be generated based on the current state bit 344 and the comparator clock signal 338. For example, a delay circuit may be programmed to generate a delay signal with a predetermined amount of time in response to the comparator clock signal 338 (or inversed comparator clock signal). A logic gate may receive the delay signal and the current state bit 344, and may generate a timing signal that may be used to indicate a metastability error in the detection block 320. For example, assuming the logic gate is an AND gate, the logic gate may determine the delayed timing signal 346 when the delay signal is asserted and the current state bit is high (i.e. logic 1). This means that until the time that the delay signal is asserted, the comparator 305 does not resolve the comparator output 342 and it is likely that there is a metastability error occurred during the bit conversion process. Thus, the delayed timing signal 346 may indicate the detection block 320 that there may be a metastability error occurred during the operation of the comparator 305. Such a logic gate may be any type of circuits configured to perform a logical function. Examples of the logic gate may include, but are not limited to, a NOT gate, an AND gate, an OR gate, a XOR gate, a NAND gate, a NOR gate, and a XNOR gate. The programmable delay circuit may include an inverter, capacitor, variable capacitor, or the like.

The detection block 320 may comprise a logic gate and a memory element to generate an error location bit 348 when there is a metastability error occurred during a bit conversion process. The logic gate may be coupled to the comparator 305 and receive the comparator output 342 to generate a logic gate output. For example, assuming the logic gate is an XNOR gate, the logic gate may receive an output p and an output m from the comparator 305. If the comparator 305 is not in a metastable state, the comparator 305 may determine which comparator output is larger and thereby produce different output values (e.g., output p=0 and output m=1). Because the XNOR gate produces an output of logic 0 when inputs are different, the output of the logic gate is logic 0 when there is no metastability error in the comparator 305. If the comparator 305 is in a metastable state, the comparator 305 may not determine which comparator output is larger and falls into the metastable state. In this case, the comparator outputs are not changed from their initial state (i.e. output p=1 and output m=1). Because the XNOR gate produces an output of logic 1 when inputs are the same, the output of the logic gate is logic 1 when there is a metastability error in the comparator 305. The logic gate used in the detection block 320 may be any type of circuits configured to perform a logical function. Examples of the logic gate may include, but are not limited to, a NOT gate, an AND gate, an OR gate, a XOR gate, a NAND gate, a NOR gate, and a XNOR gate. The programmable delay circuit may include an inverter, capacitor, variable capacitor, or the like.

The memory element in the detection block 320 may comprise multiple flip flops. Each flip flop may be connected to each bit that the SAR ADC 300 is converting. The memory element receives the logic gate output from the logic gate and the delayed timing signal 346 from the delay block 315. As described above, when there is no metastability event in the comparator 305, the logic gate output is logic 0. This logic gate output (i.e. logic 0) is captured when the delayed timing signal 346 is asserted at each flip flop. In this case, the error location bit 348 is logic 0 and may indicate that the bit is not metastable. However, when there is metastability event in the comparator 305, the logic gate output is logic 1. This logic gate output is captured when the delayed timing signal 346 is asserted at each flip flop. In this case, the error location bit 348 is logic 1 and may indicate that the bit is metastable. The memory element used in the detection block 320 may be any type of flip flops such as simple set-reset latches, gated latches, D flip flop, T flip flop, JK flip flop, or the like. The detection block 320 may be referred to as a detection module or detection circuit.

The correction block 325 may receive the error location bits 348 generated by the detection block 320, digital output bits 350, and state bits 352 and generate ADC output bits 354 in response to the sampling clock signal 334. The ADC output bits 354 are the final digital output code after the bit where the metastability error occurred is corrected. In order to generate the ADC output bits 354, the correction block 325 may first sample (or read) the error location bits 348 based on groups. As described above, the error location bit 348 indicates whether a metastability error is occurred during a bit conversion. For example, assuming that the SAR ADC 300 is converting 8 bits, if a fourth bit is the metastability error bit and the rest does not include any metastability errors, the fourth error location bit is logic 1, thereby indicating the location where the metastability error occurred. The correction block 324 may sample these error location bits 348 based on two groups. For example, the correction block 324 reads the first four error location bits 348 at the rising edge of the sampling clock signal 334. The correction block 324 may then read the remaining four error location bits 348 at the falling edge of the sampling clock signal 334. By sampling the error location bits based on groups, the memory element in the detection block 320 may be given a longer time to recover from any metastability event in the bit conversion process. For example, if a $7^{th}$ bit out of 8 bit conversion has a metastability error, the memory element in the detection block 320 is given a longer time to recover from the metastability error because the last four bits including the $7^{th}$ bit are sampled at the falling edge of the sampling clock signal 334. Although the memory element in the detection block 320 is given a longer time for the 4 least significant bits (LSBs) (i.e. last four bits) in this example, this may not be limited to the 4 LSBs. The correction block 325 may sample the error location bits 348 based on any number of groups, thereby giving the memory element of the detection block 320 longer time for the any number of LSBs (or MSBs). By sampling the error location bits 348 at different times, this technique may reduce false error indications when the memory element of the detection block 320 itself is in metastable state. Furthermore, in this example, the four most significant bits (MSBs) (i.e. first four bits) is sampled sooner and thereby they become available sooner for the subsequent serial processing at the correction block 325. The correction block 325 may also be referred to as a sampling block or sampling circuit.

Once the error location bits 348 are sampled, the correction block 325 may generate the ADC output bits 354 based on the sampled error location bits 348 and the state bits 352. As described above, the ADC output bits 354 include correction of the metastability error bit. There may be three possible scenarios. First, when all state bits are asserted (i.e. logic 1), the correction block 325 may determine that all bit conversions are successful. Thus, the correction block 354 may ignore the error location bits 348, thereby reducing the possibility of the false error indication generated falsely by the detection block 320. In this scenario, the correction block 325 may determine the digital output bits 350 as the ADC output 354.

In a second scenario, when all state bits 352 are asserted (i.e. logic 1) except the last bit (e.g., $8^{th}$ bit), the correction block 325 may determine that the LSB (i.e. last bit) has not been resolved (i.e. not determined) but all other bits have been resolved (i.e. determined). Similar to the first scenario, the correction block 325 may ignore the error location bit 348, thereby reducing the possibility of the false error indication. The correction block 325 may then assume that the last bit is a logic 0 or logic 1. In a third scenario, when some of the state bits 352 (e.g., some between $1^{st}$ and $7^{th}$ bits) are asserted (i.e. logic 1), the correction block 325 may determine the ADC output 354 based on the error location bits 348. Specifically, the correction block 325 may find the location of the bit where the metastability error is occurred based on the error location bits 348. The correction block 325 may then change a bit in the ADC output 354 at the same location to logic 1 (or logic 0) and change the remaining bits in the ADC output 354 with logic 0 (or logic 1). For example, if the error location bits indicate that a metastability error occurred on 6th bit out of 8 bit conversion (e.g., 00000100), the correction block 325: (1) determines the ADC output 354 based on digital output bits 350 up to the $6^{th}$ bit; (2) change the $6^{th}$ bit to logic 1; and (3) change the remaining $7^{th}$ and $8^{th}$ bits to logic 0s.

The correction block 325 may be any circuit that can be constructed by digital synthesis flow or hardware description language (HDL) that describes the structure and behavior of electronic circuits or digital logic circuits. The HDL may enable a precise, formal description of a logic circuit that performs the three scenarios described above to generate the ADC output 354. The examples of HDL that may be used to generate the correction block 325 may include, but are not limited to, A Hardware Programming Language (AHPL), Converter from C to Verilog (C-to-Verilog), Hardware ML (HML), SystemC, Verilog, and VHDL (VHSIC HDL). Once the ADC output 354 with error correction is generated by the correction block 325, the ADC output may be valid until the next rising edge of the sampling clock signal 334.

Figure 4A:
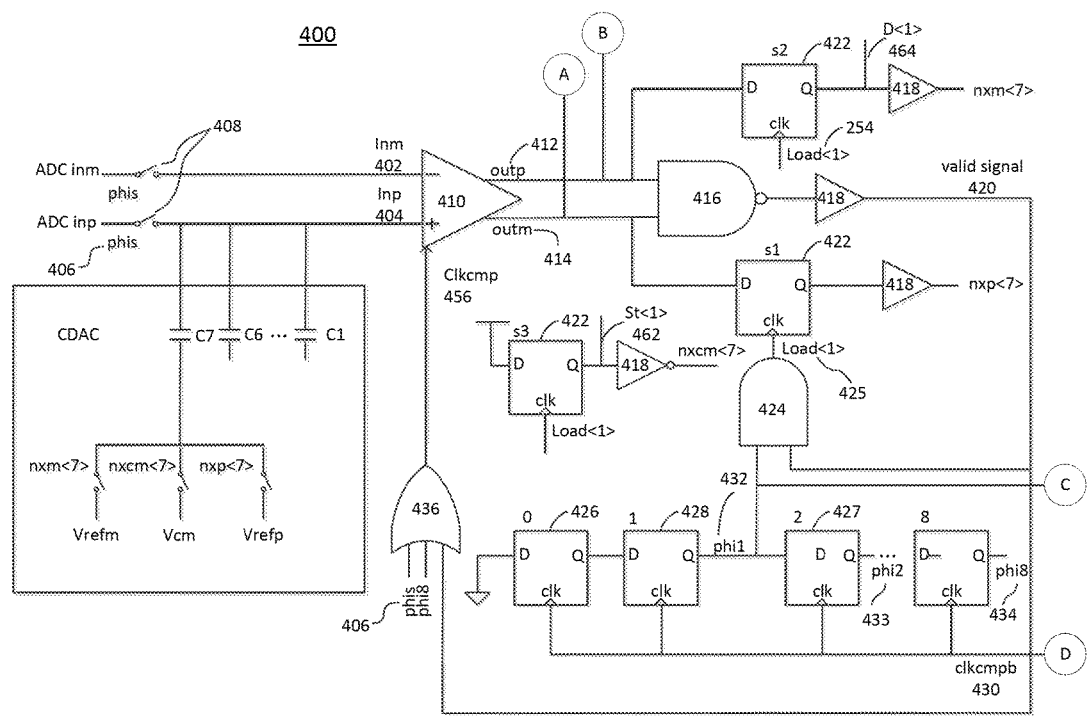
FIG. 4A is a circuit diagram illustrating an example SAR ADC for metastability error detection and correction.
Figure 4B:
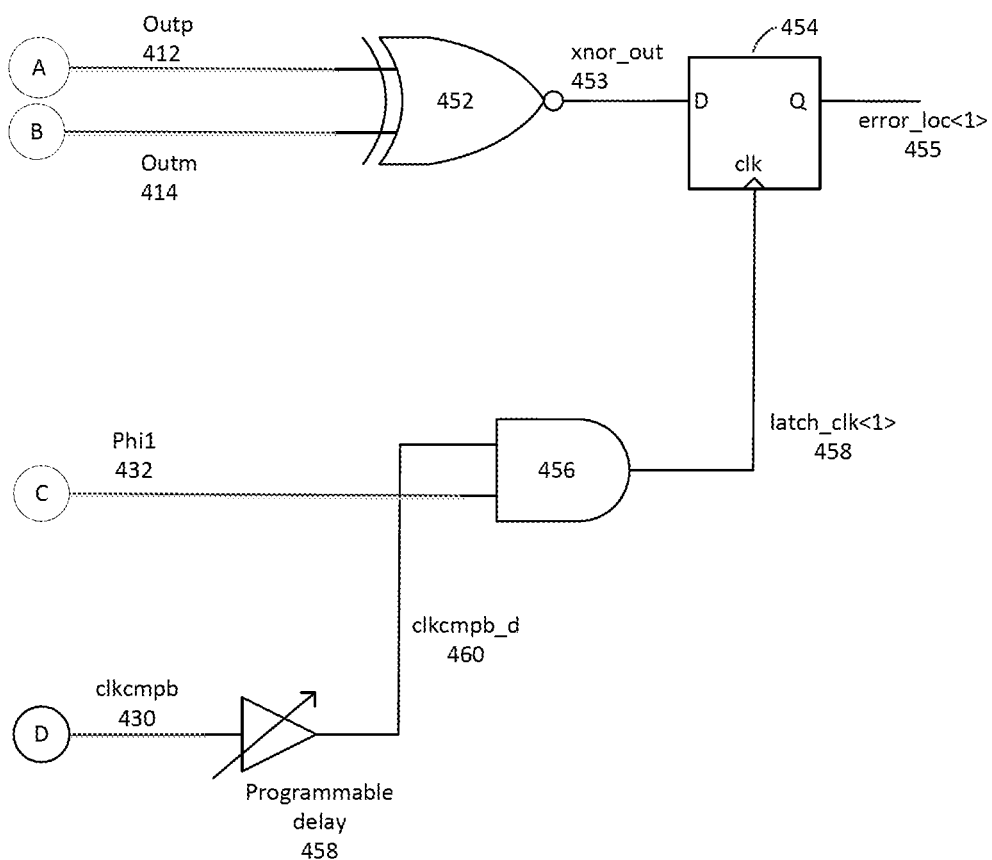
FIG. 4B is a continuation of FIG. 4A.

FIGS. 4A and 4B are circuit diagrams illustrating an example SAR ADC for metastability error detection and correction, which may be used in combination with any of the other embodiments described herein. As shown in FIGS. 4A and 4B, the SAR ADC 400 may comprise switches 408, a comparator 410, a NAND gate 416, buffer amplifiers 418, an AND gate 424, flip flops 0-8 426, 428, flip flops S1-S3 422, an OR gate 436, a capacitor DAC (CDAC) 450, a XNOR gate 452, a flip flop for metastability detection 454, an AND gate 456, and a programmable delay 458. The comparator 410, NAND gate 416, buffer amplifiers 418, AND gate 424, flip flops 0-8 426, 428, flip flops S1-S3 422, OR gate 436, and capacitor DAC (CDAC) 450 described in FIG. 4A are the same as the comparator 210, NAND gate 216, buffer amplifiers 218, AND gate 224, flip flops 0-8 226, 228, flip flops S1-S3 222, OR gate 236, and capacitor DAC (CDAC) 250 described above with respect to FIG. 2. Therefore, the details of those circuits are not repeated here.

As shown in FIGS. 4A and 4B, the XNOR gate 452 is coupled to the comparator 410 and may receive the comparator output p 412 and output m 414. The XNOR gate is a digital logic gate whose function is the logical complement of the exclusive OR (XOR) gate. If both of inputs to the XNOR gate are the same, the gate results in a high output (i.e. logic 1). If both of inputs to the XNOR gate are different, the gate results in a low output (i.e. logic 0). This means that when the comparator 410 is not in a metastable state, the comparator 410 can determines its output and produces different output values (e.g., output p 412=0 and output m 414=1 or vice versa). Upon receiving the different output values, the XNOR gate 452 produces a low output (i.e. logic 0) as an xnor_out signal 453. However, when the comparator 410 is in a metastable state, the comparator 410 may not determine its output and produces the same output values (e.g., output p 412=0 and output m 414=0 or vice versa). Upon receiving the same output values, the XNOR gate produces a high output (i.e. logic 1) as an xnor_out signal 453. Thus, when a metastability error occurs in the comparator 410, the logic 1 of the xnor_out signal 453 may be sent to a flip flop 454 to generate an error_loc bit 455.

The flip flop 454 for metastability detection may capture the xnor_out signal 453 when a latch_clk signal 458 is asserted (i.e. high). This means that when there is a metastability error in the comparator 410 and the xnor_out signal 453 received at the flip flop 454 is high, the flip flop 454 may capture the xnor_out signal 453 to its output signal (i.e. erro_loc<1> signal 455) when the latch_clk<1> 458 is asserted in the flip flop 454. Thus, when there is a metastability error in the comparator 410, the error_loc<1> 455 may be set to high (i.e. logic 1). When there is no metastability error in the comparator 410, the error_loc<1> 455 may be set to low (i.e. logic 0). If the error_loc<1> 455 is high, that indicates that may indicate that a metastability error occurred during the bit conversion process.

However, when the xnor_out signal 453, whether it is high or low, arrives at the flip flop 454 during the setup and hold window for the flip flop 454, the flip flop 454 may not accurately determine its correct output and fall into a metastable state. In this situation, the flip flop 454 may have equal chance of determining high or low for the error_loc<1> signal 455. This may trigger a false indication of metastability error. In other words, when the xnor_out signal 453 and the latch_clk<1> signal 458 comes to the flip flop 454 at the same time, the flip flop may fall into a metastable state and generate a false indication that there is a metastability error occurred even though it is not occurred in the comparator 410.

Although it is not shown in FIG. 4B, the SAR ADC 400 may include multiple flip flops 454 to detect metastability errors during a bit conversion. Each of the flip flops 454 may be connected to a XNOR gate 452 and corresponding AND gates 456 to determine whether a bit that the SAR ADC 400 is converting has a metastability error or not. For example, a flip flop #1 454 may generate an error_loc<1> signal 455 for the first bit to which the SAR ADC 400 is converting. Similarly, a flip flop #8 may generate an error_loc<8> signal to indicate whether the last bit (e.g., 8$^{th}$ bit) to which the SAR ADC 400 is converting includes an metastability error or not. Each of the error_loc bits 455 may be sampled or read by a metastability correction module (MCM) which is digitally synthesized by hardware description language (HDL) as an example.

As shown in FIG. 4B, the AND gate 456 is coupled to the flip flop 454, a programmable delay 458, and a flip flop 1 428 to generate a latch_clk<1> signal 458, which is the timing signal for metastability detection. This latch_clk<1> signal 458 may be generated based on phi1 signal 432 and clkcmpb_d signal 430. For example, when both of the phi1 signal 432 and clkcmpb_d signal 430 are asserted (i.e. logic 1), the AND gate 456 generates the latch_clk<1> signal 458. The phi1 signal 432 is generated when the clkcmpb signal 430 changes from low to high (i.e. at the rising edge) as described in FIG. 2. The clkcmpb signal 430 may also be used to generate the clkcmpb_d signal 460. The clkcmpb_d signal 460 is a delayed signal of the clkcmpb signal 430 and may be produced by a programmable delay circuit 458. The programmable delay circuit 458 may be any type of circuit that can transfer a signal after a fixed amount of delay. Examples of the programmable delay circuit 458 may include, but are not limited to, an inverter, capacitor, and variable capacitor.

Although it is not shown in FIG. 4B, the SAR ADC 400 may include multiple AND gates to generate multiple latch_clk signals 458 for multiple flip flops 454. For example, an AND gate may be coupled to a flip flop 427 and may receive phi2 signal 433 to generate a latch_clk<2> signal. The latch_clk<2> signal may be sent to the corresponding flip flop 454 to generate an error_loc<2> signal.

Figure 5:
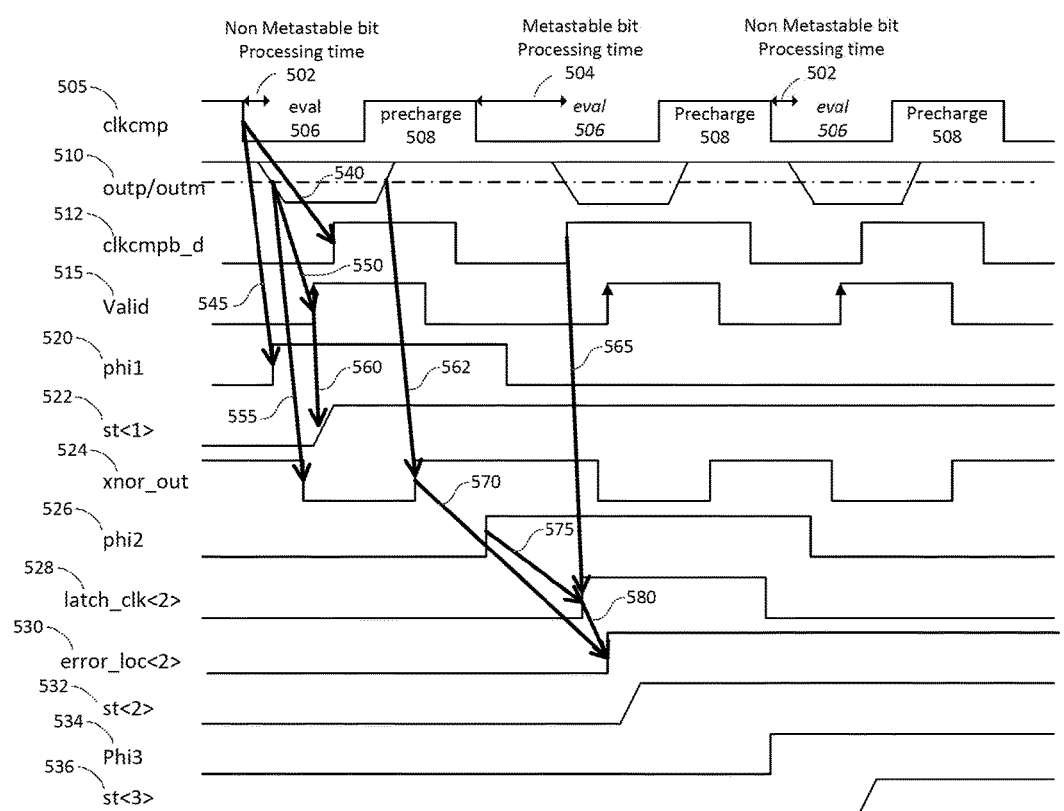
FIG. 5 is a timing diagram illustrating an example of metastability error detection and correction that may be used within the example SAR ADCs illustrated in FIGS. 3, 4A, and 4B.

FIG. 5 is a timing diagram illustrating an example of metastability error detection and correction that may be used within the example SAR ADCs illustrated in FIGS. 3, 4A, and 4B. As described above, when a clkcmp signal 505 enters into a falling edge (i.e. from high to low) by a sampling clock signal (e.g., phis signal), a comparator may enter into an evaluation phase 506. Since a clkcmpb signal is the inverse signal of clkcmp 505, the clkcmpb signal becomes a rising edge (i.e. from low to high) when the clkcmp signal 505 is in the falling edge. When the clkcmpb signal is in the rising edge, a flip flop 1 may capture the value of input (i.e. D=1) into the output (i.e. Q=1). This output of the flip flop 1 is a current state bit (i.e. phi1 520). Since the phi1 signal 520 was initially low (i.e. logic 0), as shown at step 545, at the falling edge of the clkcmp signal 305, the phi1 signal 520 may become a high state (i.e. logic 1). Moreover, at the falling edge of the clkcmp signal 505, the comparator may initiate an evaluation operation of sampled input signals (e.g., inm 402 and inp 404 in FIG. 4A) and generate outp and outm 410. Thus, as shown in FIG. 5, the phi1 520 becomes high (i.e. logic 1) before the outp and outm 510 signals become high (i.e. logic 1).

Assuming that the first bit is a non-metastable bit, once the comparator initiates the evaluation 506 of analog input signals, the comparator can determine which one of outp and outm 510 is larger after the processing time of non-metastable bit 502. Since the outp and outm 510 are not the same, a NAND gate 416 may process the outp and outm 510, thereby generating a valid signal 515 at step 550. As shown in FIG. 5, the phi1 520 is already high (i.e. logic 1) before the valid signal 315 becomes high (i.e. logic 1).

After the valid signal 515 is generated (i.e. logic 1), an AND gate 424 may generate a timing reference signal, load<1> 425. As shown at step 560, the load<1> 425 becomes high because the phi1 320 signal is already asserted (i.e. logic 1) at the time when the valid signal 515 is reached at the AND gate 424. This timing reference signal, load<1> 352, may generate st<1> signal 522 (i.e. st<1> 462 in FIG. 4A) and D<1> signal 464 in FIG. 4A. The D<1> signal 464 may indicate a bit decision (i.e. logic 0 or 1) of each conversion cycle. The st<1> signal 522 may indicate whether a bit at each conversion cycle is completed or not. If the state bit 352 is high (i.e. logic 1), the bit is determined (i.e. converted) by the comparator. This may indicate that there is no error occurred during the bit conversion process. If the st<1> signal 522 is low (i.e. logic 0), the bit is not determined (i.e. not converted) by the comparator. This may indicate that there is an error occurred during the bit conversion process. As shown in FIG. 5, the st<1> 522 is determined as high (i.e. logic 1) because the bit that the ADC is converting is a non-metastable bit. This high state for the st<1> 522 may be maintained until the last bit is converted.

Since the outp and outm 510 are different to each other as described above, the XNOR gate 452 may evaluate the outp and outm 510 and generate the xnor_out 524 as low (i.e. logic 0) at step 555. This low state of xnor_out 524 may be captured at the flip flop 454 when the latch_clk<1> 458 is asserted. The latch_clk<1> 458 may be asserted after the clkcmpb_d 512 changes from low to high at step 540. Since a D input (i.e. xnor_out 524) falls into low at step 555, the flip flop 454 may capture the value of xnot_out 524 as the error_loc<1> 455. Thus, when the bit is non-metastable bit, the error_loc<1> 455 is low (i.e. logic 0). This may indicate that there is no metastability error during the bit conversion.

When the clkcmp signal 505 changes from low to high, the comparator may enter into a precharge phase 508 until the clkcmp signal 505 changes from high to low again as shown in FIG. 5. During the precharge phase 508, the comparator does not evaluate sampled inputs (e.g., inm 402 and inp 404). This makes the comparator output, outm and outp 510, become high (i.e. logic 1) again. Since the outm and outp are both high, a NAND gate 416 may change the valid signal 515 from high to low. The XNOR gate 452 may also change the xnor_out 524 from low to high at step 562. After the valid signal 315 changes from high to low (i.e. logic 0), when it reaches the OR gate 436 again, the OR gate 436 may produce a logic 0 as its output. As described above, this output may become the clkcmp signal 505. Since the clkcmp 505 signal changes from high to low again, the comparator may initiate a second evaluation 506 of the comparator input at the falling edge of the clkcmp signal 505.

Assuming that the second bit is a metastable bit, once the comparator initiates the second evaluation 506, the comparator may not determine which one of outp and outm 510 is larger within a certain amount of time for the proper operation. In an embodiment, the comparator may not determine the output until the processing time for a metastable bit 504. The processing time for the metastable bit 504 may expire before or after the clkcmpb_d 512 is asserted (i.e. logic 1). Once the clkcmpb_d 512 is asserted after the delayed amount of time, at steps 565 and 575, an AND gate 456 may generate a latch_clk<2> 528 based on the clkcmpb_d 512 and the phi2 526. At this point, the phi2 526 is already high (i.e. logic 1) because the clkcmpb signal 430 is asserted regardless of the valid signal 515 as described above.

As described above, because the outp and outm 510 are the same, the XNOR gate 452 may evaluate the outp and outm 501 and generate the xnor_out 524 as high (i.e. logic 1) at step 562. This high state of xnor_out 524 may be captured at the flip flop 454 when the latch_clk<2> 528 is asserted at steps 570 and 580. As a result, the error_loc<2> 530 may be changed from low to high and remained until the end of bit conversion as shown in FIG. 5. This error_loc<2> 530 indicate that the second bit is a metastable bit. Although the error_loc<2> 530 is asserted to indicate the metastable error, the comparator may recover from the metastable error and eventually determine its output as shown in FIG. 5. Thus, the st<2> 532 may be changed from low to high after the processing time for the metastable bit 504. The rest of bits other than the first and second bits may follow the above procedures whether the bit is a metastable or non-metastable bit.

Figure 6:
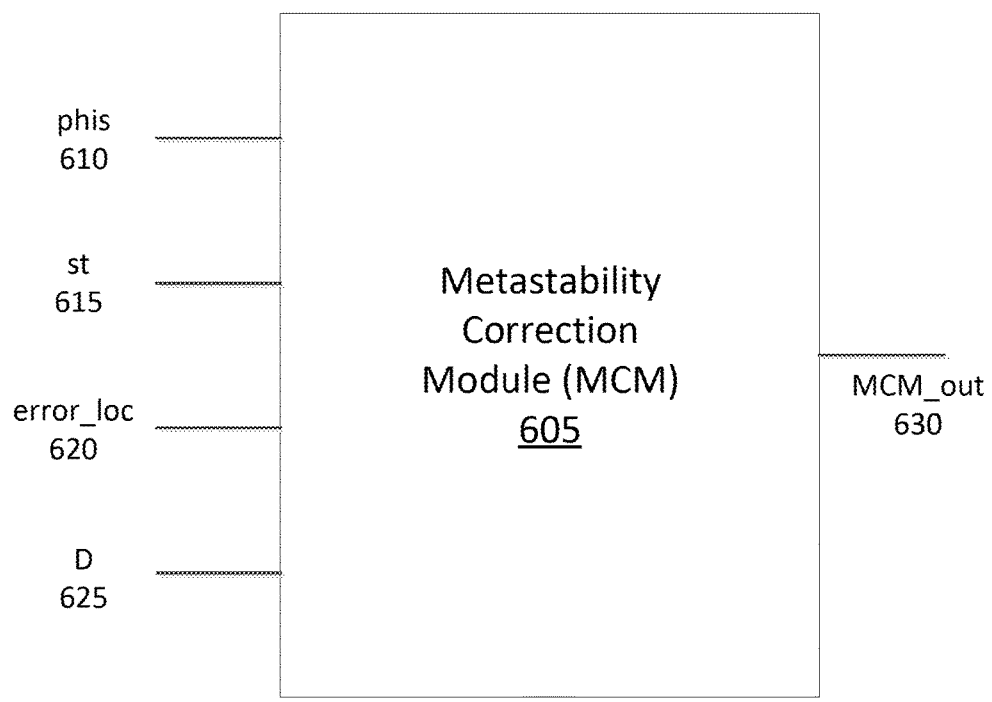
FIG. 6 is a block diagram illustrating an example metastability correction module (MCM)

FIG. 6 is a block diagram illustrating an example metastability correction module (MCM) 605, which may be used in combination with any of the other embodiments described herein. As described above, the MCM 605 is a circuit that may be structurally constructed by digital synthesis flow or hardware description language (HDL) to perform metastability error detection and correction. Examples of HDL may include Verilog, Very-High-Speed Integrated Circuit HDL (VHDL), Altera HDL (AHDL), or the like. The MCM 605 may also be referred to as a correction module, correction circuit, sampling module, or sampling circuit.

As shown in FIG. 6, the input to the MCM 605 may include phis signal 610, st bits 615, Error_loc bits 620, and D bits 625. The phis signal 610 may be a sampling clock signal 334 (or sampling reference signal) illustrated in FIG. 3 or a phis signal 406 illustrated in FIG. 4A. The phis signal 610 may be initialized to a high state (i.e. logic 1) when switches 408 in FIG. 4A are connected. The phis 610 may change from high (i.e. logic 1) to low (i.e. logic 0) as the switches 408 are disconnected. In response to the phis signal 610, the MCM 605 may generate, based on the st bits 615, Error_loc bits 620, and D bits 625, an MCM_out 630 which is the output of SAR ADC.

Each of the st bits 615 may indicate whether a bit is completely resolved by a comparator. Specifically, when comparator outputs are different, a valid signal may be generated and an st bit 615 may be asserted. This means that the particular bit is resolved by the comparator and the SAR ADC has a digital output, a D bit 625, for that particular bit. For example, assuming that a first bit that the SAR ADC is trying to convert is a non-metastable bit, the comparator may generate different outp 412 and outm 414. The NAND gate 416 may then process the comparator outputs and generate a valid signal 420. The valid signal 420 will be used to generate st<1> bit 462 at the s3 flip flop 422. This means that the comparator 410 has resolved the first bit and the digital output of the first bit (i.e. D<1>) has been generated. Once the st bit 615 is generated as high, it may remain until the end of the entire bit conversion.

As described above, each of the D bits 625 may be a digital output bit and indicate whether a bit decision is high or low (i.e. logic 1 or logic 0). The D bit 625 may be available when an st bit 615 is available. For example, when comparator outputs are different, a valid signal is generated. When the valid signal is generated, an st bit 615 may be determined as high or low (i.e. logic 1 or 0) and a D bit 625 may also be determined as high (i.e. logic 1). Accordingly, the SAR ADC has a digital output of logic 1 for that particular bit. Each of the error_loc bits 620 may indicate the location of error when a metastability event has occurred in a comparator or a memory element. For example, if an error_loc bit 620 is asserted (i.e. high) when a third bit is converted, the error_loc bit 620 indicates that the location of metastability error is the third bit. At most one error_loc bit 620 may be high during the entire bit conversion process.

The MCM_out 630 may be the ADC output code after the bit where a metastability error has occurred is corrected. In order to generate the MCM_out 630, the MCM 605 may first sample (or read) the error_loc bits 625 based on groups. For example, in a 8 bit conversion, the MCM 605 may read the st bits 615, D bits 625, and a first group of four error_loc bits 620 at the rising edge of phis signal 610. The MCM 605 may then read a second group of four error_loc bits 620 at the falling edge of phis signal 610. The first group of four error_loc bits 620 may be the first four bits positioned toward the most significant bit (MSB). The second group of four error_loc bits 620 may be the last four bits positioned toward the least significant bit (MSB). The group of error_loc bits 620 may be any number of groups depending on the number of bit conversion. Furthermore, error_loc bits 620 in a group may be selected in any order. For example, a first group of error_loc bits 620 may include every other error_loc bits 620 and a second group of error_loc bits 620 may include the rest of error_loc bits 620. After the last group of error_loc bits 620 is sampled at the falling edge of phis signal 610, the MCM 605 may generate the MCM_out 630 based on the st bits 615, error_loc bits 620, and D bits 625.

Since the actual location where the metastability error has occurred is known, the MCM_out 630 may be produced with the correction of the metastability error. Specifically, the MCM 605 may consider three possible scenario: (1) when all st bits 615 are asserted; (2) when all st bits 615 are asserted except the last one (e.g., st<8>); and (3) when some of the st bits 615 (e.g., some bits between st<1> and st<<7>) are asserted.

In the first scenario, when all of the st bits 615 are asserted, this condition may mean that the SAR ADC has completed all bit conversions.

Therefore, the MCM 605 may ignore the outputs of metastability detection block (i.e. error_loc bits 620). This condition may remove the possibility of the false error detected by the metastability detection block. Specifically, as described above with respect to FIG. 4B, when xnor_out 453 is entered into the memory element (i.e. flip flop 454) during the setup and hold window of the memory element, the memory element may not accurately determine its output and trigger a false indication of metastability error (i.e. error_loc bits 620 falsely indicate any error location). However, by ignoring the output of metastability detection block (i.e. error_loc bits 620) when all of the st bits 615 are asserted, the MCM 605 may remove the possibility of the false error indication. In this condition, the MCM 605 may determine the MCM_out 630 as D bits 625.

In the second scenario, when all the st bits 615 are asserted except the last bit (e.g., st<8>), this condition may means that the LSB (e.g., $8^{th}$ bit) has not been resolved and all other bits (e.g., $1^{st}$ bit to $7^{th}$ bit) have been resolved. In this scenario, the MCM 605 may ignore the output of metastability detection block (i.e. error_loc bits 620). Since the output of metastability detection block is ignored, the false indication of the metastability error by the memory element may be removed. The MCM 605 may then assume the last bit is either a logic 0 or a logic 1. Thus, the maximum error may be only less than one LSB, which cause minimum degradation to achievable linearity or effective number of bits (EBON).

In the third scenario, when some of the st bits 615 (e.g. some bits between st<1> and st<7> in 8 bit conversion) are asserted, the MCM 605 may generate the MCM_out 630 by considering the error location indicate by the error_loc bits 625. For example, in an ADC with a resolution of 8 bits, if a $6^{th}$ bit of the st bits 615 is not asserted (i.e. logic 0) and the rest of remaining st bits 615 are all asserted (i.e. 11111011), the MCM 605 may change the $6^{th}$ bit of the MCM_out 630 with a logic 1 (or a logic 0) and the rest of bits following the $6^{th}$ bit with logic S (or logic 1s) (i.e. 11111100). In this scenario, since the location of metastability error is known and the bit of MCM_out 630 where the metastability error has occurred is rectified, the false indication of the metastability error by the memory element may be reduced. Moreover, the false indication of the metastability error may also be reduced by allowing more time for the memory element to recover from its own metastability.

Figure 7:
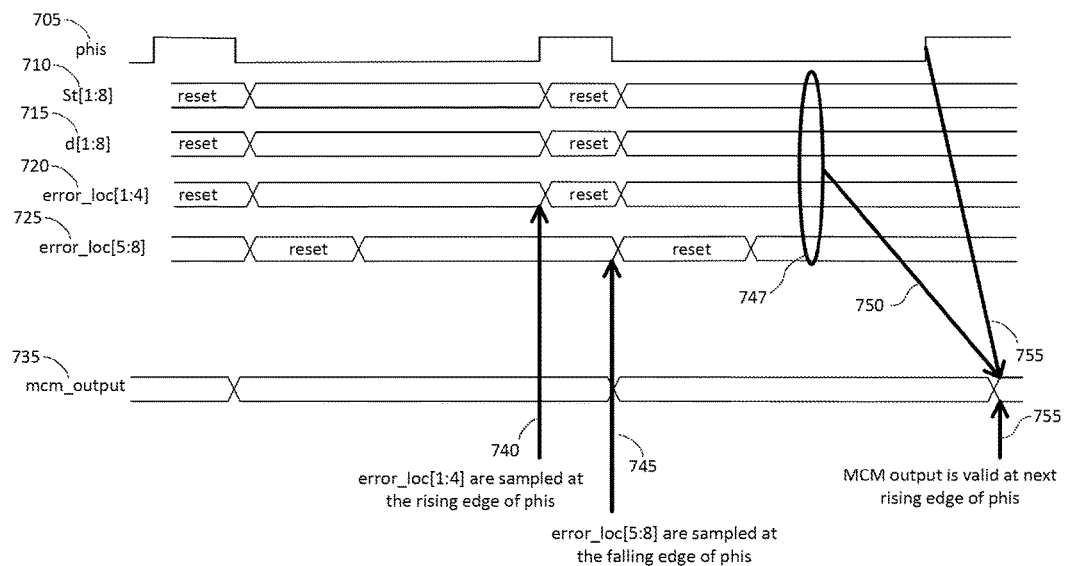
FIG. 7 is a timing diagram illustrating an example of metastability error detection and correction that may be used within the example MCM illustrated in FIG. 6.

FIG. 7 is a timing diagram illustrating an example of metastability error detection and correction that may be used within the example MCM illustrated in FIG. 6. As shown in FIG. 7, MCM inputs may include phis signal 705, st[1:8] bits 710, d[1:8] bits 715, error_loc[1:4] bits 720, and error_loc[5:8] bits 723. Based on these inputs, the MCM may generate mcm_output bits 735. Specifically, at step 740, the error_loc[1:4] bits 720 may be sampled at the rising edge of phis signal 705. At step 745, the error_loc[5:8] bits 725 may be sampled at the falling edge of the phis signal 705. By sampling the error_loc bits 720, 725 at different times, the memory element of metastability detection block may be given a longer time to recover from any metastability event in a bit conversion process. In other words, the 4 LSBs (i.e. error_loc[5:8] bits) may be given a longer time to process in the event where the memory element of the metastability detection block itself suffers metastability.

For example, assuming that an ADC with a resolution of 8 bits converts analog signals to digital signals within the fixed duration of phis low 765, the fixed duration of phis high 760 may take approximately 15% of the fixed duration of phis low 765. Once the conversion started, each of the error_loc bits 720, 725 may take approximately 12.5% of the fixed duration of phis low 765. For example, the memory element of the metastability detection block may generate a first error_loc bit (i.e. error_loc[1]) within approximately 12.5% of the fixed duration of phis low 765. If the memory element of the metastability detection block itself suffers metastability while the ADC is converting a third bit, the memory element has enough time to determines the error_loc[3] bit (e.g., approximately 75% of the during of phi low 765 left) after it recovers from the metastability. However, if the memory element suffers metastability while the ADC is converting a $7^{th}$ bit, the memory element may not have enough time to determine the error_loc[7] bit (e.g., approximately 25% of the during of phi low 765 left) after it recover from the metastability.

As described above, by sampling the error_loc[5:8] bits 725 at the falling edge of the phis signal 705, the memory element of metastability detection block may be given a longer time to recover from the metastability event. For example, if the metastability at the memory element occurred at a $7^{th}$ bit, the memory element may have approximately 40% of the during of phi low 765 (i.e. 25% for the remaining 2 bits plus 15% of the duration of phis high 760). Thus, this additional time may help the memory element reduce the false error indication problems where the memory element itself is in metastable state. Additionally, since the MSBs (i.e. error_loc[1:4] bits 720 is sampled sooner, they may be available for the subsequent MCM processing sooner.

Once the error_loc[1:4] bits 720 and error_loc[5:8] bits 723 are sampled, the MCM may generate mcm_output 735 at step 747 by using both the st[1:8] 710 and the error_loc bits 720, 723 as described above. As shown at step 750, this mcm_out 735 may be valid until the next rising edge 755 of phis signal 705. At the next falling edge of phis signal, the mcm_out 735 may be initialized. As described above, the MCM may also reduce the probability of a false metastability error indication by using both the st[1:8] 710 and the error_loc bits 720, 723 for a decision on error correction.

Figure 8:
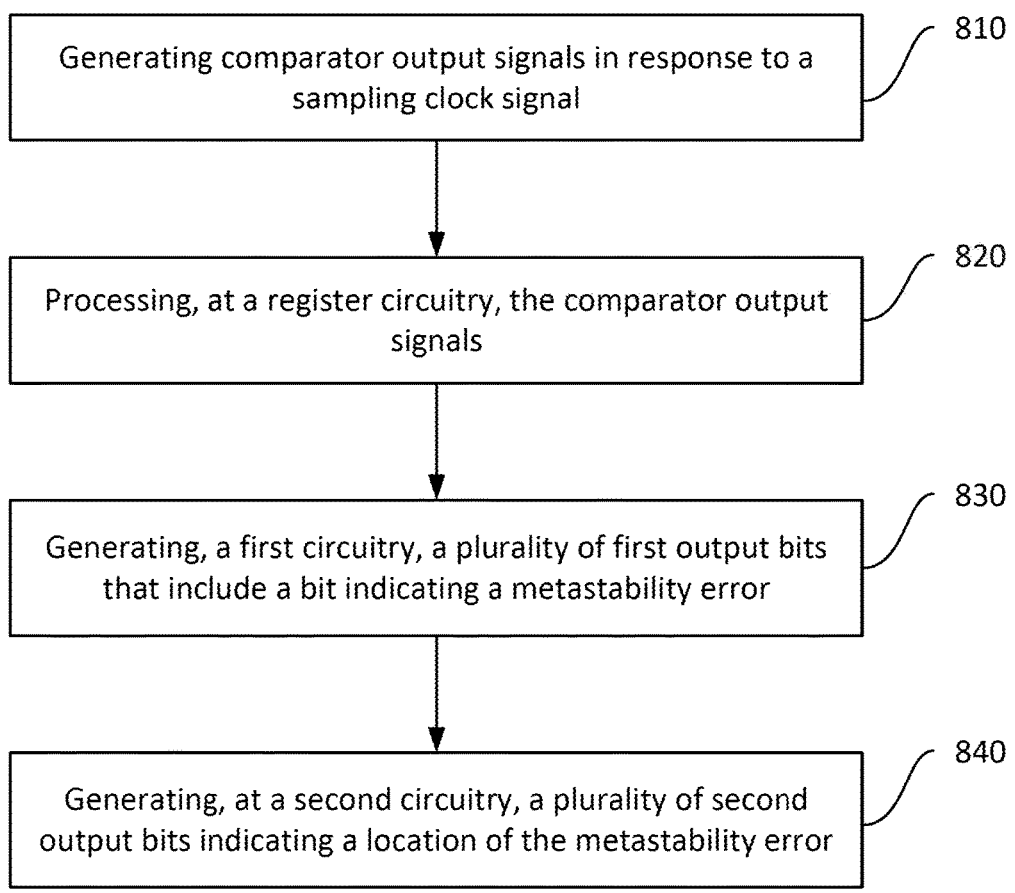
FIG. 8 is a diagram illustrating an example process for metastability error detection and correction.

FIG. 8 is a diagram illustrating an example process for metastability error detection and correction, which may be used in combination with any of the other embodiments described herein. For example, at step 810, a comparator may compare an analog input signal to a reference signal and generate a comparator output signal, in response to a sampling clock signal. At step 820, the comparator output signal may be further processed by a register circuit to generate a state bit and a digital output bit. The state bit may indicate whether the comparator completely resolve (or determine) a particular bit that the ADC is trying to convert. For example, when the comparator outputs are different, the comparator may be able to determine which one is larger and the register circuit may generate a state bit of logic 1. This means that the particular bit is resolved by the comparator and the register circuit may also generate a digital output bit of logic 1. As described above, the register circuit may include logic gates and flip flops.

If a metastability error occurred during a bit conversion process, at step 830, a first circuit may generate a plurality of first output bits that include a bit indicating a metastability error. As described above, the first circuit may comprise a first logic gate, a second logic gate, and a memory element. The first logic gate may process the comparator output signals and generate a logic gate output for the memory element. This logic gate output may be the input signal for the memory element. If the comparator is in metastable state, the logic gate output is high (i.e. logic 1) indicating that a metastability error occurred in the comparator. If the comparator is not in metastable state, the logic gate output is low (i.e. logic 0) indicating that no metastability error occurred in the comparator. The second logic gate may generate a delay clock signal based on a current state bit and a comparator clock signal as described above. The first and second logic gate in the first circuit may be any type of circuits configured to perform any logical operation. Examples may include, but are not limited to, a NOT gate, an AND gate, an OR gate, a XOR gate, a NAND gate, a NOR gate, and a XNOR gate. The programmable delay circuit may include an inverter, capacitor, variable capacitor, or the like.

If the logic gate output from the first logic gate is asserted (i.e. logic 1), the memory element of the first circuit may generate a first output bit when the delay clock signal comes into the memory element. The memory element may include multiple flip flops that are connected to the first and second logic gate to receive the logic gate output and the delay clock signal. Each of the multiple flip flops may generate a first output bit corresponding to the respective bit that the comparator is processing. The first circuit may be referred to as a detection block, detection module, detection circuit or the like.

Once the plurality of first output bits are generated by the first circuit, at step 840, the second circuit may generate a plurality of second output bits by sampling the plurality of first output bits based on groups. For example, the plurality of second output bits may be sampled using a first group of the plurality of first output bits and a second group of the plurality of first output bits, in response to the sampling clock signal. The first group of the plurality of first output bits may be a plurality of bits positioned toward a most significant bit (MSB). For example, in an ADC with a resolution of 8 bits, the first 4 bits may be included in the first group. The second group of the plurality of first output bits may be a plurality of bits positioned toward a least significant bit (LSB). For example, in an ADC with a resolution of 8 bits, the last 4 bits may be included in the second group.

As described above, the first and second group of the plurality of first output bits may be sampled at different times to give the memory element of the first circuit a longer time to recover from the metastability. For example, the first group of the plurality of first output bits may be sampled at a rising edge of the sampling clock signal. The second group of the plurality of first output bits may be sampled at a falling edge of the sampling clock signal. Although the plurality of first output bits are sampled based on two groups in this example, the number of groups may be increased depending on the number of bit resolution that the ADC is converting.

Once the plurality of second output bits is generated at step 840, the plurality of second output bits may indicate the location of metastability error during the bit conversion process. For example, if the third bit of the plurality of second output bits is asserted (i.e. logic 1), this indicates that a metastability error is occurred when the comparator is processing the $3^{rd}$ bit. With this location information of metastability error, the second circuit may further process the ADC output bits as described above. The second circuit may be any circuit that can be constructed by digital synthesis flow or hardware description language (HDL) as describe above. The second circuit may also be referred to as a correction block, correction circuit, sampling block, sampling circuit or the like.

It should be understood that many variations are possible based on the disclosure herein. Although features and elements are described above in particular combinations, each feature or element may be used alone without the other features and elements or in various combinations with or without other features and elements.

The methods provided may be implemented in an electrical circuit, analog circuit, hardware, converter, general purpose computer, a processor, or a processor core. Suitable processors include, by way of example, a general purpose processor, a special purpose processor, a conventional processor, a digital signal processor (DSP), a plurality of microprocessors, one or more microprocessors in association with a DSP core, a controller, a microcontroller, metal-oxide semiconductor field-effect transistors (MOSFETs), ASICs, FPGAs circuits, any other type of integrated circuit (IC), and/or a state machine. Such processors may be manufactured by configuring a manufacturing process using the results of processed hardware description language (HDL) instructions and other intermediary data including netlists (such instructions capable of being stored on a computer readable media). The results of such processing may be maskworks that are then used in a semiconductor manufacturing process to manufacture a processor that implements aspects of the embodiments.

The suitable processors may include circuitry to implement the methods provided herein. The circuitry may include receiving circuitry, processing circuitry and transmitting circuitry.

The methods and flow charts provided herein may also be implemented in a computer program, software, or firmware incorporated in a non-transitory computer-readable storage medium for execution by a general purpose computer or a processor. Examples of non-transitory computer-readable storage media, include, but are not limited to, a read only memory (ROM), a random access memory (RAM), a register, cache memory, semiconductor memory devices, magnetic media such as internal hard disks and removable disks, magneto-optical media, and optical media such as CD-ROM disks, and digital versatile disks (DVDs).

Further, the devices according to various embodiments described herein may be interspersed among other devices depending on the functionality of the microelectronic device. In addition, the number and components of the devices may vary depending on the functionality of the microelectronic device. By way of example, the number of correlators may vary from two to dozens.

What is claimed is:

1. An analog-to-digital converter (ADC) comprising:
   a comparator configured to generate a comparator output signal in response to a sampling clock signal;

a register circuit, operatively coupled to the comparator, configured to process the comparator output signal;

a first circuit operatively coupled to the comparator and the register circuit, the first circuit being configured to generate a plurality of first output bits that include a bit indicating a metastability error on a condition that the metastability error occurred during a bit conversion; and a second circuit operatively coupled to the first circuit, the second circuit being configured to generate a plurality of second output bits based on a first group of the plurality of first output bits and a second group of the plurality of first output bits, in response to the sampling clock signal, wherein the plurality of second output bits indicates a bit location of the metastability error occurred during the bit conversion.

2. The ADC of claim 1, wherein the first group of the plurality of first output bits are sampled at a rising edge of the sampling clock signal.

3. The ADC of claim 1, wherein the second group of the plurality of first output bits are sampled at a falling edge of the sampling clock signal.

4. The ADC of claim 1, wherein the first group of the plurality of first output bits are sampled earlier than the second group of the plurality of first output bits.

5. The ADC of claim 1, wherein the first group of the plurality of first output bits is a plurality of bits positioned toward a most significant bit (MSB).

6. The ADC of claim 1, wherein the second group of the plurality of first output bits is a plurality of bits positioned toward a least significant bit (LSB).

7. The ADC of claim 1, wherein the first circuit further comprises:

a first logic gate, operatively coupled to the comparator, configured to generate an output signal indicating that the metastability error has occurred;

a second logic gate, operatively coupled to the register, configured to generate a delay clock signal; and a memory element, operatively coupled to the first and second logic gates, configured to generate, based on the output signal and the delay clock signal, the plurality of first output bits.

8. The ADC of claim 7, wherein the first logic gate is an XNOR gate and the second logic gate is an AND gate.

9. The ADC of claim 7, wherein the memory element comprises a plurality of flip-flop circuits.

10. The ADC of claim 7, wherein the bit indicating the metastability error among the plurality of first output bits is high (logic 1) on a condition that both the output signal and the delay clock signal are high (logic 1).

11. A method for use in an analog-to-digital converter (ADC), the method comprising:

comparing, at a comparator, an analog input signal to a reference signal to generate an comparator output signal in response to a sampling clock signal;

processing, at a register circuit, the comparator output signal;

generating, at a first circuit, a plurality of first output bits that include a bit indicating a metastability error on a condition that the metastability error occurred during a bit conversion; and generating, at a second circuit, a plurality of second output bits based on a first group of the plurality of first output bits and a second group of the plurality of first output bits, in response to the sampling clock signal, wherein the plurality of second output bits indicates a bit location of the metastability error occurred during the bit conversion.

12. The method of claim 11, further comprising: sampling the first group of the plurality of first output bits at a rising edge of the sampling clock signal.

13. The method of claim 11, further comprising: sampling the second group of the plurality of first output bits at a falling edge of the sampling clock signal.

14. The method of claim 11, further comprising: sampling the first group of the plurality of first output bits earlier than the second group of the plurality of first output bits.

15. The method of claim 11, wherein the first group of the plurality of first output bits is a plurality of bits positioned toward a most significant bit (MSB).

16. The method of claim 11, wherein the second group of the plurality of first output bits is a plurality of bits positioned toward a least significant bit (LSB).

17. The method of claim 11, further comprising:

generating, at a first logic gate, an output signal indicating that the metastability error has occurred;

generating, at a second logic gate, a delay clock signal; and generating, at a memory element, the plurality of first output bits based on the output signal and the delay clock signal, wherein the first circuit further comprises the first logic gate, the second logic gate, and the memory element.

18. A metastability error detector for an analog-to-digital converter (ADC) comprising:

a detection circuit configured to generate a plurality of first output bits that include a bit indicating a metastability error on a condition that the metastability error occurred during the bit conversion; and a sampling circuit configured to sample a plurality of second output bits using a first group of the plurality of first output bits and a second group of the plurality of first output bits, wherein the plurality of second output bits indicates a location of the metastability error.

19. The metastability error detector of claim 18, wherein the first group of the plurality of first output bits are sampled earlier than the second group of the plurality of first output bits.

20. The metastability error detector of claim 18, wherein the first group of the plurality of first output bits is a plurality of bits positioned toward a most significant bit (MSB) and the second group of the plurality of first output bits is a plurality of bits positioned toward a least significant bit (LSB).

* * * * *